United States Patent
Shin et al.

(10) Patent No.: US 9,070,715 B2
(45) Date of Patent: Jun. 30, 2015

(54) METHOD FOR FABRICATING ARRAY SUBSTRATE AND FABRICATION APPARATUS USED THEREFOR

(71) Applicant: Samsung Display Co., Ltd., Yongin, Gyeonggi-do (KR)

(72) Inventors: Sangwon Shin, Yongin-si (KR); Hyunju Kang, Pocheon-si (KR); Sangwoo Sohn, Yongin-si (KR); Sukyoung Yang, Chuncheon-si (KR); Changoh Jeong, Suwon-si (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 13/716,972

(22) Filed: Dec. 17, 2012

(65) Prior Publication Data
US 2013/0280838 A1    Oct. 24, 2013

(30) Foreign Application Priority Data
Apr. 18, 2012    (KR) .................. 10-2012-0040399

(51) Int. Cl.
| H01L 23/34  | (2006.01) |
| H01L 29/66  | (2006.01) |
| H01L 21/324 | (2006.01) |
| H01L 21/67  | (2006.01) |
| H01L 21/677 | (2006.01) |
| H01L 27/12  | (2006.01) |

(52) U.S. Cl.
CPC ........ *H01L 29/66742* (2013.01); *H01L 21/324* (2013.01); *H01L 21/67109* (2013.01); *H01L 21/67201* (2013.01); *H01L 21/67745* (2013.01); *H01L 27/1262* (2013.01)

(58) Field of Classification Search
CPC . H01L 21/324; H01L 21/44; H01L 29/66742; H01L 29/66; H01L 21/67201; H01L 21/67196
USPC .................. 438/34, 795; 165/64, 96; 257/712, 257/E33.075, E31.131
See application file for complete search history.

(56) References Cited

U.S. PATENT DOCUMENTS

| 4,065,594 | A   | 12/1977 | Shii et al. |
| 4,452,298 | A   | 6/1984  | Rahmfeld |
| 4,651,047 | A   | 3/1987  | Comberg et al. |
| 4,834,941 | A   | 5/1989  | Shiina |
| 4,899,080 | A   | 2/1990  | Vriens et al. |
| 5,332,979 | A   | 7/1994  | Roskewitsch et al. |
| 5,662,469 | A * | 9/1997  | Okase et al. ............ 432/6 |
| 5,811,055 | A   | 9/1998  | Geiger |

(Continued)

*Primary Examiner* — Jarrett Stark
*Assistant Examiner* — Shahed Ahmed
(74) *Attorney, Agent, or Firm* — F. Chau & Associates, LLC

(57) ABSTRACT

Provided is a method for fabricating an array substrate. The method for fabricating the array substrate includes forming a semiconductor layer on a substrate, forming a gate electrode which is insulated from the semiconductor layer, forming source and drain electrodes which are insulated from the gate electrode and connected to the semiconductor layer, and forming a pixel electrode connected to the drain electrode. Here, at least one of the forming of the gate electrode, the forming of the source and drain electrodes, and the forming of the pixel electrode includes forming a conductive layer on the substrate, cooling the substrate on which the conductive layer is formed to a temperature of no greater than about 0° C., heating the cooled substrate, and patterning the conductive layer.

2 Claims, 14 Drawing Sheets

(56) References Cited

U.S. PATENT DOCUMENTS

| | | | |
|---|---|---|---|
| 5,838,568 A | 11/1998 | Dickinson et al. | |
| 5,914,055 A | 6/1999 | Roberts et al. | |
| 5,967,871 A | 10/1999 | Kaake et al. | |
| 6,165,810 A | 12/2000 | Morimoto | |
| 6,235,634 B1 * | 5/2001 | White et al. | 438/680 |
| 6,307,318 B1 | 10/2001 | Kaake et al. | |
| 6,844,979 B2 | 1/2005 | Maki et al. | |
| 6,873,639 B2 | 3/2005 | Zhang | |
| 7,726,819 B2 | 6/2010 | Shouji | |
| 8,122,846 B2 | 2/2012 | Stiblert et al. | |
| 2002/0000242 A1 | 1/2002 | Matushita et al. | |
| 2006/0056031 A1 | 3/2006 | Capaldo et al. | |
| 2006/0057421 A1 | 3/2006 | Maria et al. | |
| 2006/0257785 A1 | 11/2006 | Johnson | |
| 2006/0284313 A1 | 12/2006 | Wang | |
| 2008/0025823 A1 * | 1/2008 | Harumoto | 414/217.1 |
| 2008/0253085 A1 | 10/2008 | Soffer | |
| 2009/0123329 A1 | 5/2009 | San Juan Nunez et al. | |
| 2010/0051586 A1 | 3/2010 | Guerrina et al. | |
| 2011/0253037 A1 * | 10/2011 | Tsunekawa et al. | 118/50 |
| 2011/0315346 A1 * | 12/2011 | Nishimura et al. | 165/96 |
| 2012/0193071 A1 * | 8/2012 | Tsunekawa et al. | 165/61 |
| 2012/0295028 A1 * | 11/2012 | Zenitani | 427/255.5 |
| 2014/0054164 A1 * | 2/2014 | Yamaguchi et al. | 204/192.12 |

* cited by examiner

METHOD FOR FABRICATING ARRAY SUBSTRATE AND FABRICATION APPARATUS USED THEREFOR

CROSS-REFERENCE TO RELATED APPLICATIONS

This U.S. non-provisional patent application claims priority under 35 U.S.C. §119 to Korean Patent Application No. 10-2012-0040399, filed on Apr. 18, 2012, the entire disclosure of which is hereby incorporated by reference herein in its entirety.

(i) TECHNICAL FIELD

The present disclosure herein relates to a method for fabricating an array substrate and a fabrication apparatus used therefor, and more particularly, to a method for fabricating an array substrate which can prevent the array substrate from being warped after a metal layer deposition process is performed, and a fabrication apparatus used therefore.

(ii) DISCUSSION OF THE RELATED ART

With the rapid development of the information society, there is a demand for flat panel display devices having beneficial characteristics, such as, for example, slim profile, lightweight and low power consumption. In response to the above demand, an active matrix display device including a thin film transistor on a transparent insulative substrate is being developed.

The thin film transistor may include, for example, a plurality of conductive patterns and a plurality of insulation layers. Thus, to manufacture the thin film transistor, a plurality of conductive pattern formation processes and a plurality of insulation layer formation processes may be required. For example, a conductive pattern formation process may be performed by depositing a conductive layer using a physical vapor deposition (PVD) process or a chemical vapor deposition (CVD) process to pattern the conductive layer using a photolithograph process.

However, a conductive layer deposition process such as the PVD process or the CVD process may be performed at, for example, a high temperature. Thus, after the conductive layer is deposited, the substrate may be warped. The warpage of the substrate may occur because the transparent insulative substrate and the conductive layer have shrinkages different from each other due to a thermal expansion coefficient difference therebetween.

SUMMARY

Exemplary embodiments of the inventive concept provide a method for fabricating an array substrate which can prevent a warpage phenomenon of the substrate from occurring.

Exemplary embodiments of the inventive concept provide a fabrication apparatus which can be used for the method for fabricating the array substrate.

Exemplary embodiments of the inventive concept provide a method for fabricating an array substrate, the method including: forming a semiconductor layer on a substrate, forming a gate electrode which is insulated from the semiconductor layer, forming source and drain electrodes which are insulated from the gate electrode and connected to the semiconductor layer and forming a pixel electrode connected to the drain electrode. At least one of the forming of the gate electrode, the forming of the source and drain electrodes, and the forming of the pixel electrode includes: forming a conductive layer on the substrate, cooling the substrate on which the conductive layer is formed to a temperature of no greater than about 0° C., heating the cooled substrate and patterning the conductive layer.

In an embodiment, the substrate may be cooled to a temperature of about −25° C. to about −60° C.

In an embodiments of the inventive concept, a method for fabricating an array substrate includes: forming a semiconductor layer on a base substrate, forming a first conductive layer which is insulated from the semiconductor layer, performing a first cooling process for cooling the base substrate on which the first conductive layer is formed to a temperature of no greater than about 0° C., performing a first heating process for heating the cooled base substrate on which the first conductive layer is formed to room temperature, patterning the first conductive layer to form a gate electrode, forming a second conductive layer which is insulated from the gate electrode and connected to the semiconductor layer, performing a second cooling process for cooling the base substrate on which the second conductive layer is formed, performing a second heating process for heating the cooled base substrate on which the second conductive layer is formed to room temperature, patterning the second conductive layer to form source and drain electrodes connected to the semiconductor layer, forming a third conductive layer connected to the drain electrode, performing a third cooling process for cooling the base substrate on which the third conductive layer is formed, performing a third heating process for heating the cooled base substrate on which the third conductive layer is formed to room temperature and patterning the third conductive layer to form a pixel electrode connected to the drain electrode.

In an exemplary embodiment of the inventive concept, an apparatus for fabricating an array substrate includes: a cooling chamber and a heating chamber. The cooling chamber includes a first chamber housing providing a space for receiving a target substrate on which a conductive layer is disposed and a cooling plate disposed within the first chamber housing which is configured to seat the target substrate thereon and to cool the target substrate. The heating chamber includes a second chamber housing providing a space for receiving the cooled target substrate and a heating plate disposed within the second chamber housing which is configured to seat the target substrate thereon and to heat the target substrate.

In an exemplary embodiment of the inventive concept, an apparatus for fabricating an array substrate includes: a substrate treatment chamber configured to cool and heat a target substrate on which a conductive layer is disposed. The substrate treatment chamber includes: a chamber housing providing an inner space for receiving the target substrate, a cooling plate disposed in the inner space which is configured to seat the target substrate thereon and to cool the target substrate, a substrate elevation device disposed under the cooling plate which is configured to space the target substrate apart from the cooling plate and a heating plate disposed in the inner space which is configured to heat the target substrate spaced apart from the cooling plate.

In an exemplary embodiment of inventive concept, a method for fabricating an array substrate using an apparatus including a cooling chamber including a first chamber housing providing a space for receiving a target substrate on which a conductive layer is disposed and a cooling plate disposed within the first chamber housing and a heating chamber including a second chamber housing providing a space for receiving the cooled target substrate and a heating plate disposed within the second chamber housing.

The method of using the apparatus includes cooling the target substrate on which the conductive layer is disposed on the cooling plate in the first chamber housing to a temperature of no greater than about 0° C., transferring the cooled target substrate from the cooling plate onto the heating plate in the second chamber housing and heating the cooled target substrate on the heating plate in the second chamber housing to room temperature.

In an exemplary embodiment of the inventive concept, a method for fabricating an array substrate using an apparatus includes a substrate treatment chamber including a chamber housing providing an inner space for receiving a target substrate on which a conductive layer is disposed, a cooling plate disposed in the inner space of the chamber housing, a substrate elevation device disposed under the cooling plate and a heating plate disposed in the inner space of the chamber housing and spaced apart from the cooling plate.

The method of using the apparatus includes cooling the target substrate on which the conductive layer is disposed on the cooling plate in the chamber housing to a temperature of no greater than 0° C., operating the substrate elevation device to space the cooled target substrate apart from the cooling plate and heating the cooled target substrate on the heating plate to room temperature.

BRIEF DESCRIPTION OF THE DRAWINGS

Exemplary embodiments of the inventive concept can be understood in more detail from the following detailed description taken in conjunction with the attached drawings. In the drawings.

DETAILED DESCRIPTION OF EXEMPLARY EMBODIMENTS

Figure 1:
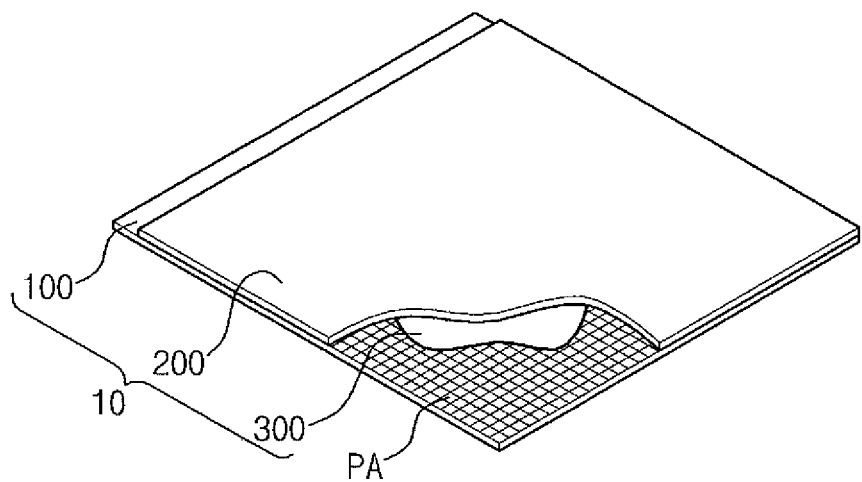
FIG. 1 is a perspective view of a display device.

Exemplary embodiments of the inventive concept will be described below in more detail with reference to the accompanying drawings.

It will be understood that when an element or layer is referred to as being "on", "connected to" or "coupled to" another element or layer, it can be directly on, connected or coupled to the other element or layer or intervening elements or layers may be present.

Like numbers refer to like elements throughout. As used herein, the term "and/or" includes any and all combinations of one or more of the associated listed items. In the drawings, the thickness of layers, films, panels, regions, etc., may be exaggerated for clarity.

As used herein, the singular forms, "a", "an" and "the" are intended to include the plural forms as well, unless the context clearly indicates otherwise.

FIG. 1 is a perspective view of a display device.

Referring to FIG. 1, a display device includes at least display panel 10.

The display panel 10 may be, for example, an active matrix display panel.

Also, various types of display panels may be applied to the display panel 10. For example, the display panel 10 may include one of an organic light emitting display panel (OLED) panel, a liquid crystal display (LCD) panel, an electrophoretic display (EPO) panel, and an electrowetting display (EWD) panel. When a non-emissive display panel such as the LCD panel, the EPO panel, or the EWD panel is used as the display panel 10, the display panel 10 may include, for example, a backlight unit (not shown) for supplying light into the display panel 10. In this embodiment, the LCD panel will be exemplified as the display panel 10.

The display panel 10 has, for example, a rectangular plate shape with long sides and short sides to display an image in a display region. Also, the display panel 10 includes an array substrate 100, an opposite substrate 200 disposed facing the array substrate 100, and a liquid crystal layer 300 disposed between the array substrate 100 and the opposite substrate 200.

The array substrate 100 may have, for example, a plurality of pixel regions PA having a matrix shape. Each of the pixel regions PA includes a thin film transistor (not shown) electrically connected to a gate line (not shown) and a data line (not shown). The thin film transistor is electrically connected to a pixel electrode to transmit a driving signal transmitted from the data line into the pixel electrode.

Also, a driver IC (not shown) may be disposed on a side of the array substrate 100. The driver IC receives various signals from the outside. Then, the driver IC responds to the various input signals to output the driving signal for operating the display panel 10 into the thin film transistor.

The opposite substrate 200 may include, for example, an RGB color filter (not shown) for realizing a predetermined color using light provided from the backlight unit on one surface thereof and a common electrode (not shown) disposed on the RGB color filter to face the pixel electrode. Here, the RGB color filter may be manufactured using a thin film formation process. The RGB color filter is disposed on the opposite substrate 200 in the present exemplary embodiment but exemplary embodiments of the inventive concept are not limited thereto. For example, the RGB color filter may be disposed on the array substrate 100.

The liquid crystal layer 300 may be arranged in a specific direction by a voltage applied to the pixel electrode and the common electrode to adjust transmittance of the light provided from the backlight unit so that the display panel 10 displays an image.

At least one of the array substrate 100 and the opposite substrate 200 may further include, for example, a black matrix (not shown) disposed in a region between pixels. The black matrix may prevent light transmitted through the respective pixels from interfering with each other to thereby increase the contrast of the display panel 10. Alternatively, in an exemplary embodiment, the black matrix may be omitted.

Figure 2:
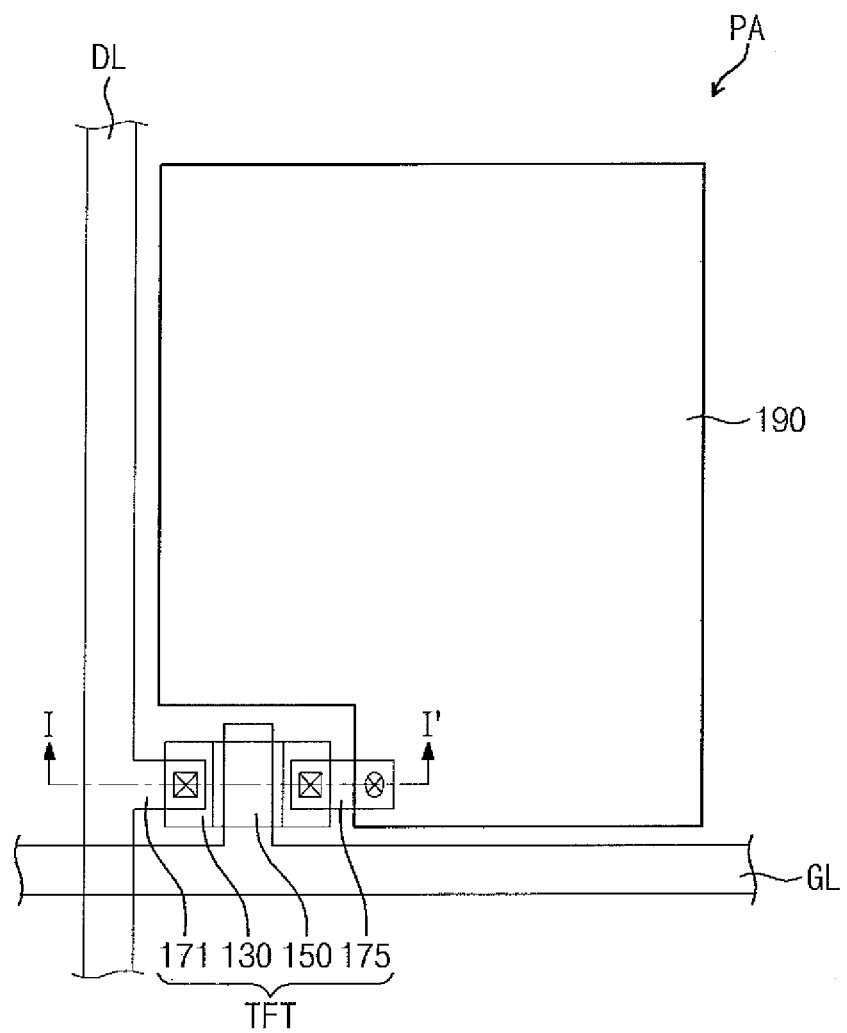
FIG. 2 is a plan view for explaining one pixel region on an array substrate of FIG. 1.
Figure 3:
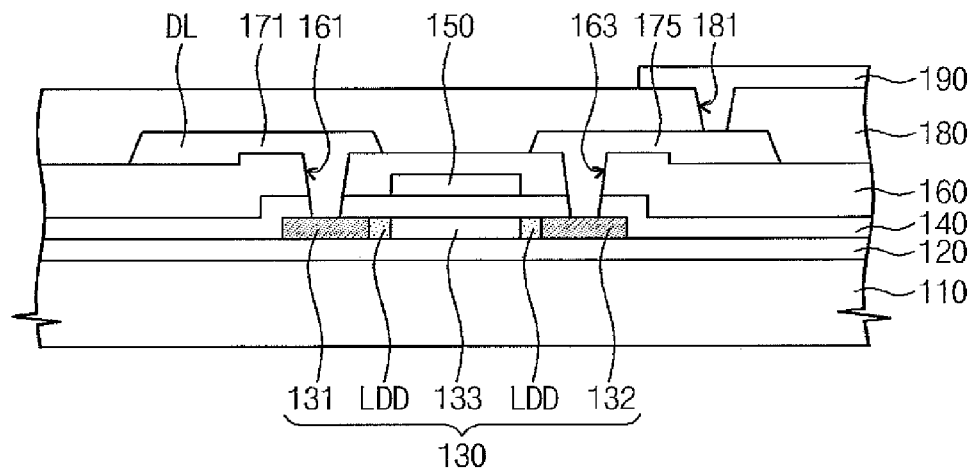
FIG. 3 is a sectional view taken along line I-I' of FIG. 2.

FIG. 2 is a plan view for explaining one pixel region on an array substrate of FIG. 1. FIG. 3 is a sectional view taken along line I-I' of FIG. 2.

Referring to FIGS. 2 and 3, the array substrate 100 may be divided into a plurality of pixel regions PA. The array substrate 100 includes, for example, a base substrate 110, a gate line GL disposed on the base substrate 110 to extend in a first direction, a data line DL insulated from the gate line GL to extend in a second direction crossing the first direction, a thin film transistor TFT connected to the gate line GL and the data line DL, and a pixel electrode 190 connected to the thin film transistor TFT. However, exemplary embodiments of the inventive concept are not limited to above positions for the gate line and data line. For example, alternatively in an exemplary embodiment of the inventive concept, the data line DL may instead extend in the first direction and the gate line GL may instead extend in the second direction crossing the first direction.

Hereinafter, the array substrate 100 will be described in detail.

The base substrate 110 contains, for example, a transparent insulation material so that light is transmitted therethrough. For example, the base substrate 110 may be formed of a transparent insulation material such as glass, quartz, or plastic. The transparent plastic may be, for example, one of polycarbonate (PC), polyester (PET), polypropylene (PP), polyethylene (PE) and polymethyl methacrylate (PMMA). Alternatively, the base substrate 110 may instead be formed of a non-transparent material such as, for example, a silicon plate or ceramics. Also, the base substrate 110 may have, for example, a rectangular plate shape with long sides and short sides.

The thin film transistor TFT may include, for example, a semiconductor layer 130, a gate electrode 150, a source electrode 171, and a drain electrode 175.

The semiconductor layer 130 may be disposed on the base substrate 110. The semiconductor layer 130 may be formed of one of, for example, an amorphous silicon, a poly silicon, and a single crystal silicon. Also, the semiconductor layer 130 may include, for example, source and drain regions 131 and 132, each being doped with n-type impurities or p-type impurities, and a channel region 133 disposed between the source region 131 and the drain region 132. Also, the semiconductor layer 130 may further include, for example, low concentration impurity regions LDD disposed between the source region 131 and the channel region 133 and disposed between the drain region 132 and the channel region 133. The low concentration impurity region LDD represents a region having an impurity concentration less than the impurity concentrations of the source region 131 and the drain region 132. As described above, when the semiconductor layer 130 includes the low concentration impurity region LDD, the semiconductor layer 130 may be increased in stability, and degradation due to hot carriers and off leakage current may be minimized.

A buffer layer 120 may be disposed between the base substrate 110 and the semiconductor layer 130. The buffer layer 120 may be formed of, for example, at least one of silicon oxide (SiOx, x≥1) silicon nitride (SiNx, x≥1) and silicon oxynitride (SiON). Also, the buffer layer 120 may have a single layer structure. Also, the buffer layer 120 may have, for example, a multi-layered structure which includes at least two of the following layers of a silicon oxide layer, a silicon nitride layer and a silicon oxynitride layer which are stacked on each other. The buffer layer 120 may prevent impurities such as metal ions contained in the base substrate 110 from being diffused into the semiconductor layer 130. Alternatively, the buffer layer 120 may instead be omitted, if desired depending upon the type and process conditions of the base substrate 110.

The gate electrode 150 may be disposed on the semiconductor layer 130. Also, the gate electrode 150 may be insulated from the semiconductor layer 130 by a first insulation layer 140 disposed between the semiconductor layer 130 and the gate electrode 150. Also, the gate electrode 150 may extend, for example, from the gate line GL into the pixel region PA. Also, the gate electrode 150 may overlap the channel region 133.

A second insulation layer 160 may be disposed on the gate electrode 150 to cover an entire surface of the base substrate 110. Here, the second insulation layer 160 has, for example, a first contact hole 161 through which a portion of the source region 131 is exposed and a second contact hole 163 through which a portion of the drain region 132 is exposed.

The source electrode 171 and the drain electrode 175 are disposed, for example, on the second insulation layer 160. Here, for example, the source electrode 171 contacts the source region 131 through the first contact hole 161, and the drain electrode 175 contacts the drain region 132 through the second contact hole 163. Also, the source electrode 171 may extend from the data line DL into the pixel region PA. Also, at least one portion of the source electrode 171 may overlap the source region 131. Although not shown, an ohmic contact layer (not shown) may be disposed between the source region 131 and the source electrode 171 and between the drain region 132 and the drain electrode 175.

A third insulation layer 180 is disposed on the thin film transistor TFT. A portion of the third insulation layer 180 may be removed to expose a portion of the drain electrode 175. Here, the region of the third insulation layer 180 through which the portion of the drain electrode 175 is exposed may be called a via hole 181. Also, the third insulation layer 180 may be, for example, an organic-inorganic composite membrane. Thus, a stepped portion of the array substrate 100 which occurs by the thin film transistor TFT may be removed and planarized.

For example, in an exemplary embodiment, the first insulation layer 140, the second insulation layer 160 and the third insulation layer 180 may be made of, for example, silicon nitride (SiNx), silicon oxide (SiOx), silicon oxynitride (SiOxNy), aluminum oxide (AlOx), yttrium oxide ($Y_2O_3$), hafnium oxide (HfOx), zirconium oxide (ZrOx), aluminum nitride (AlN), aluminum oxynitride (AlNO), titanium oxide (TiOx), barium titanate ($BaTiO3$), lead titanate ($PbTiO_3$), benzocyclobutene (BCB), an acrylic material or a combination thereof.

The pixel electrode 190 contacts the drain electrode 175 through the via hole 181. Thus, the pixel electrode 190 may receive a driving signal of the display device inputted from the data line DL through the thin film transistor TFT.

Here, the pixel electrode 190 may be formed of, for example, a transparent conductive material. For example, the pixel electrode 190 may be formed of one of transparent conductive oxides such as indium tin oxide (ITO), indium zinc oxide (IZO), aluminum zinc oxide (AZO), gallium doped zinc oxide (GZO), zinc tin oxide (ZTO), GTO (gallium tin oxide), and FTQ (fluorine doped tin oxide). The pixel electrode 190 may be mainly formed of, for example, the ITO. Alternatively, the pixel electrode 190 may be composed of, for example, a reflective electric conductor such as aluminum (Al), gold (Au), silver (Ag), copper (Cu), iron (Fe), titanium (Ti), tantalum (Ta), molybdenum (Mo), rubidium (Rb), tungsten (W), and alloys, or combinations thereof.

A method for fabricating the array substrate 100 includes, for example, a process for forming a conductive layer on the base substrate 110, the first insulation layer 140, the second insulation layer 160, and the third insulation layer 180 to pattern the conductive layer using a photolithograph process, thereby forming electric wiring parts such as the gate electrode 150, the gate line GL, the data line DL, the source electrode 171, the drain electrode 175, and the pixel electrode 190.

For example, to form the conductive layer, a physical vapor deposition (PVD) process or a chemical vapor deposition (CVD) process is performed. The PVD process and the CVD process are performed at, for example, a high temperature of no less than about 100° C. Also, the patterning of the conductive layer is performed using, for example, a dry etching or wet etching process. Also, the patterning of the conductive layer is performed, for example, at a temperature which is less than the temperature used for the forming of the conductive layer.

Thus, in the patterning of the conductive layer, a stress may be applied to the base substrate 110 due to a thermal expansion coefficient difference between the base substrate 110 and the conductive layer to cause warpage of the base substrate 110.

Figure 4:
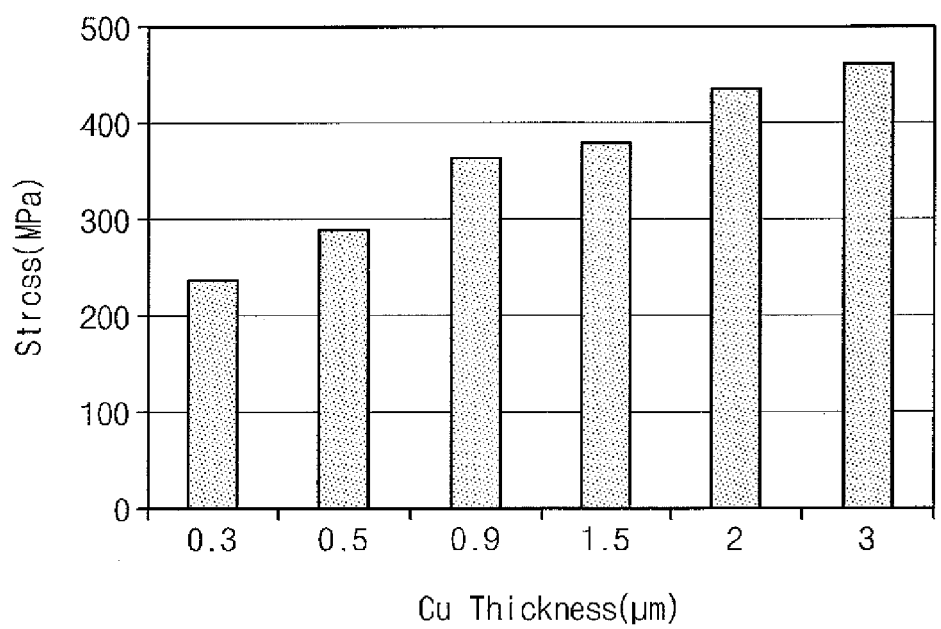
FIG. 4 is a graph illustrating a stress measured according to a thickness of a conductive layer of a target substrate.
Figure 5:
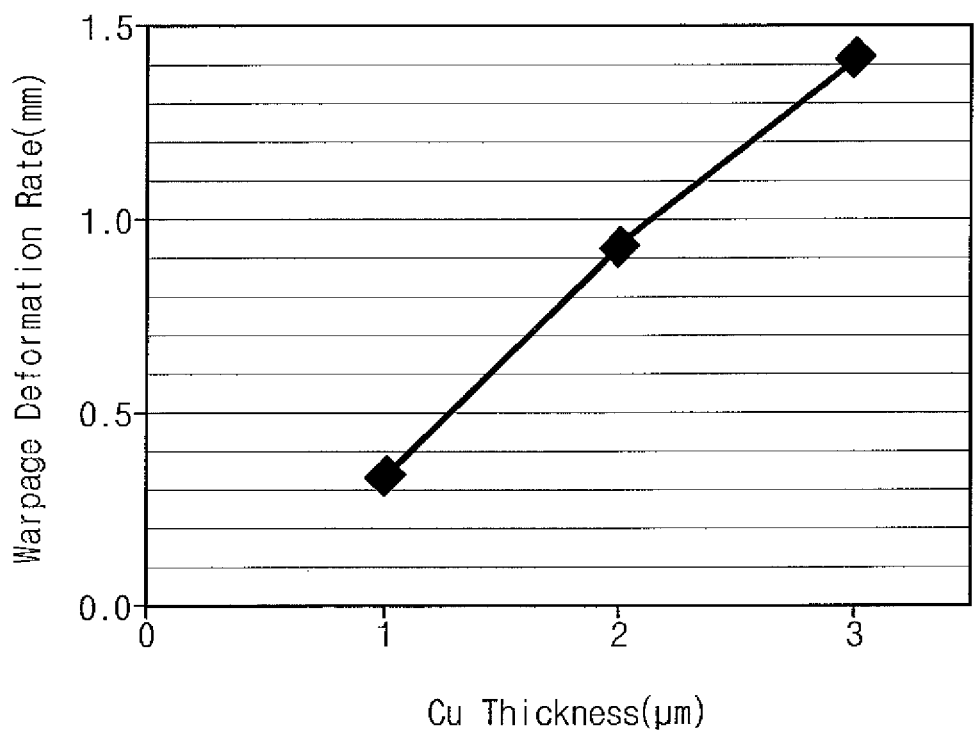
FIG. 5 is a graph for explaining warpage deformation of a target substrate according to a thickness of a conductive layer.

FIG. 4 is a graph illustrating a stress measured according to a thickness of a conductive layer of a target substrate. FIG. 5 is a graph for explaining warpage deformation of a target substrate according to a thickness of a conductive layer. Here, the target substrate may manufactured by, for example, forming a conductive layer formed of a copper (Cu) material on a base substrate formed of a transparent glass material with a thickness of about 0.5 mm.

Referring to FIGS. 4 and 5, it is seen that the more the thickness of the conductive layer is increased, the more the stress applied to the base substrate may be increased. That is, the more the thickness of the conductive layer disposed on the base substrate is increased, the more the stress applied to the base substrate may be increased because the conductive layer is increased in shrinkage during the cooling of the base substrate.

Thus, as shown in FIG. 5, the more the conductive layer is increased in thickness, the more the warpage of the base substrate may be increased.

Thus, in the base substrate 110 disposed on the conductive layer, the stress acting on the base substrate 110 should be relieved.

Figure 6:
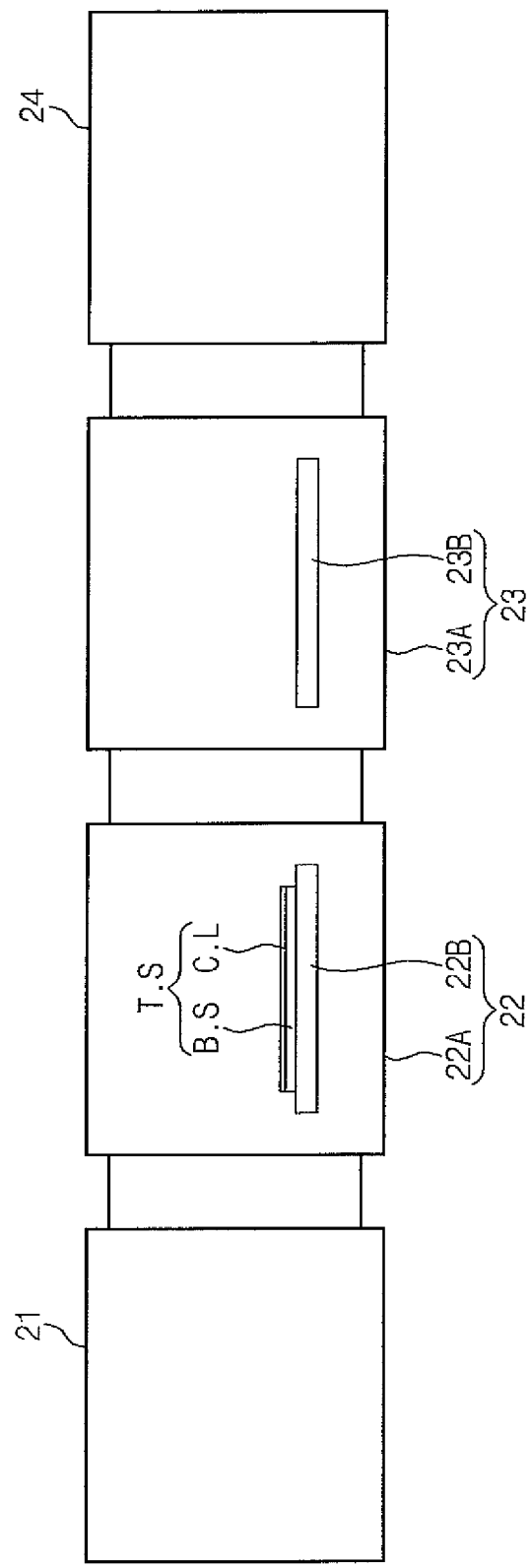
FIG. 6 is a conceptual view for explaining an apparatus for fabricating an array substrate according to an exemplary embodiment of the inventive concept.

FIG. 6 is a conceptual view for explaining an apparatus for fabricating an array substrate according to an exemplary embodiment of the inventive concept. For example, referring to FIG. 6, an apparatus for manufacturing an array substrate may include a first load lock chamber 21, a cooling chamber 22, a heating chamber 23, and a second load lock chamber 24.

The first load lock chamber 21 connects the cooling chamber 22 to air at an atmospheric pressure. When a target substrate T.S is put into the first load lock chamber 21 under atmospheric pressure, the first load lock chamber 21 has, for example, a vacuum state similar to that of the cooling chamber 22. Thus, the first load lock chamber 21 may serve as a buffer chamber for preventing the cooling chamber 22 from being suddenly changed in environment when the target substrate T.S is loaded.

The target substrate T.S may include, for example, a conductive layer C.L disposed on a base substrate B.S. The base substrate B.S may be, for example, a transparent insulative substrate such as a transparent glass substrate, a transparent quartz substrate, or a transparent plastic substrate. The transparent plastic substrate may include, for example, one of polycarbonate (PC), polyester (PET), polypropylene (PP), polyethylene (PE) and polymethyl methacrylate (PMMA). Alternatively, the base substrate B.S may instead be formed of a non-transparent material such as, for example, a silicon plate or ceramics. Also, an insulation layer (not shown) may be disposed between the base substrate B.S. and the conductive layer C.L.

For example, in an exemplary embodiment, the conductive layer CI may have, for example, a single layer structure formed of one of copper (Cu), molybdenum tungsten (MOW), aluminum (Al), neodymium (Nd), aluminum neodymium (AlNd), molybdenum (Mo), titanium (Ti), titanium tungsten (TiW), tantalum (Ta), chromium (Cr), tungsten (W), gold (Au), palladium (Pd), platinum (Pt), nickel (Ni), zinc (Zn), cobalt (Co) or alloys thereof.

Alternatively, for example, the conductive layer C.L may have, for example, a multi-layered structure in which two or more layers of a Cu layer, a Cu alloy layer, a MoW layer, a MoW alloy layer, an Al layer, an Al alloy layer, an AlNd layer, an AlNd alloy layer, a Mo layer, a Mo alloy layer, a TiW layer, a TiW alloy layer, a Ta layer, a Ta alloy layer a Cr layer, a Cr alloy layer, a W layer, a W alloy layer, an Au layer, an Au alloy layer, a Pd layer, a Pd alloy layer, a Pt layer, a Pt alloy layer, a Ni layer, a Ni alloy layer, a Zn layer, a Zn alloy layer, a Co layer, a Co alloy layer are stacked on each other. Also, the conductive layer CI may be formed of, for example, one of the following transparent conductive oxides such as indium tin oxide (ITO), indium zinc oxide (IZO), Indium Tin Zinc Oxide (ITZO), aluminum zinc oxide (AZO), gallium doped zinc oxide (GZO), zinc tin oxide (ZTO), GTO (gallium tin oxide), and FTQ (fluorine doped tin oxide).

The second load lock chamber 24 connects the heating chamber 23 to air at an atmospheric pressure state, unlike the first load lock chamber 21. When the target substrate T.S is taken from the heating chamber 23 and placed into the second load lock chamber 24, the second load lock chamber 24 becomes, for example, in a state similar to the atmospheric pressure state. Thus, the second load lock chamber 24 may serve as a buffer chamber for preventing the heating chamber 23 from being suddenly changed into the atmospheric pressure state when the target substrate T.S is loaded therein.

The cooling chamber 22 may include, for example, a first chamber housing 22A and a cooling plate 22B. The first chamber housing 22A may provide an inner space for receiving the target substrate T.S and the cooling plate 22B. Also, the inner space of the first chamber housing 22A may be maintained in a vacuum state. The target substrate T.S may be seated on the cooling plate 22B. Thus, the cooling plate 22B may cool the target substrate T.S to a temperature of, for example, no greater than about 0° C. Here, the cooling plate 22B may cool the target substrate T.S to a temperature of, for example, about −25° C. to about −60° C.

The heating chamber 23 may include, for example, a second chamber housing 23A and a heating plate 23B. The second chamber housing 23A may provide an inner space for receiving the target substrate T.S and the heating plate 23B, similar to the first chamber housing 22A. Also, the inner space of the second chamber housing 23A may be maintained, for example, in a vacuum state. The target substrate T.S may be seated on the heating plate 23B. Thus, the heating plate 23B may heat the target substrate T.S to, for example, room temperature.

All of the inner spaces of the first load lock chamber 21, the cooling chamber 22, the heating chamber 23, and the second load lock chamber 24 should be maintained, for example, in the vacuum state. For example, to maintain the inner spaces in the vacuum state, an exhaust tube disposed on a side of each of the chambers 21, 22, 23, and 24 and a vacuum pump connected to the exhaust tube may be further provided.

Hereinafter, an operation of the apparatus for fabricating the array substrate will be described by way of example.

First, the conductive layer C.L may be disposed on the base substrate B.S to fabricate the target substrate T.S.

Then, the target substrate T.S is provided into the first load lock chamber 21 of the apparatus for fabricating the array substrate. Here, all of the inner spaces of the cooling chamber 22 and the heating chamber 23 may be maintained in the vacuum state.

When the target substrate T.S is provided into the first load lock chamber 21, the first load lock chamber 21 may be operated by, for example, the vacuum pump to change the inner space thereof into the vacuum state.

When the inner space of the first load lock chamber 21 is maintained in the vacuum state, the target substrate T.S may be transferred into the cooling chamber 22 to seat the target substrate T.S on the cooling plate 22B. Here, the base substrate B.S may contact the cooling plate 22B.

When the target substrate T.S is seated on the cooling plate 22B, the cooling plate 22B cools the target substrate T.S to a temperature of, for example, no greater than about 0° C. For example, the cooling plate 22B may cool the target substrate T.S to a temperature of about −25° C. to about −60° C.

The cooled target substrate T.S is provided into the heating chamber 23 and then seated on the heating plate 23B. When the target substrate T.S is seated on the heating plate 23B, the heating plate 23B heats the target substrate T.S to room temperature.

The heated target substrate T.S is provided into the second load lock chamber 24. The second load lock chamber 24 is maintained in the vacuum state before the target substrate T.S is provided therein. After the target substrate T.S is provided into the second load lock chamber 24, the inner space of the second load lock chamber 24 is increased up to an atmospheric pressure state.

As described above, in the target substrate T.S in which the conductive layer C.L is disposed on the base substrate B.S, a stress applied to the base substrate B.S due to the cooling and heating of the target substrate T.S may be relieved using the apparatus for fabricating the array substrate.

Figure 7:
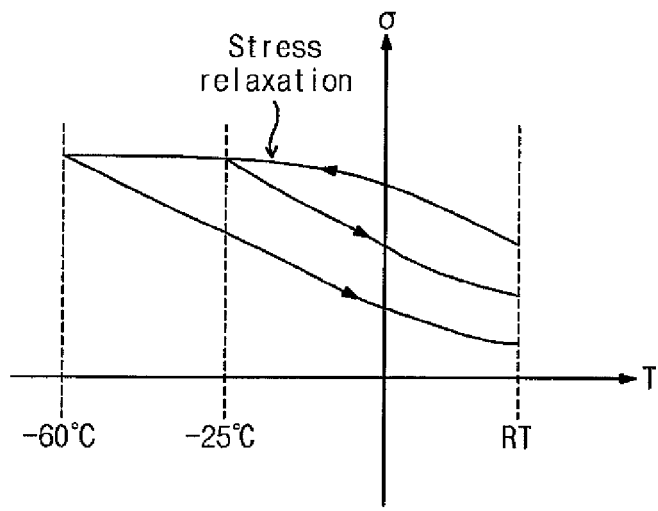
FIG. 7 is a graph for explaining a variation of a stress occurring in a target substrate when the target substrate is cooled and heated using the apparatus for fabricating the array substrate of FIG. 6.
Figure 8:
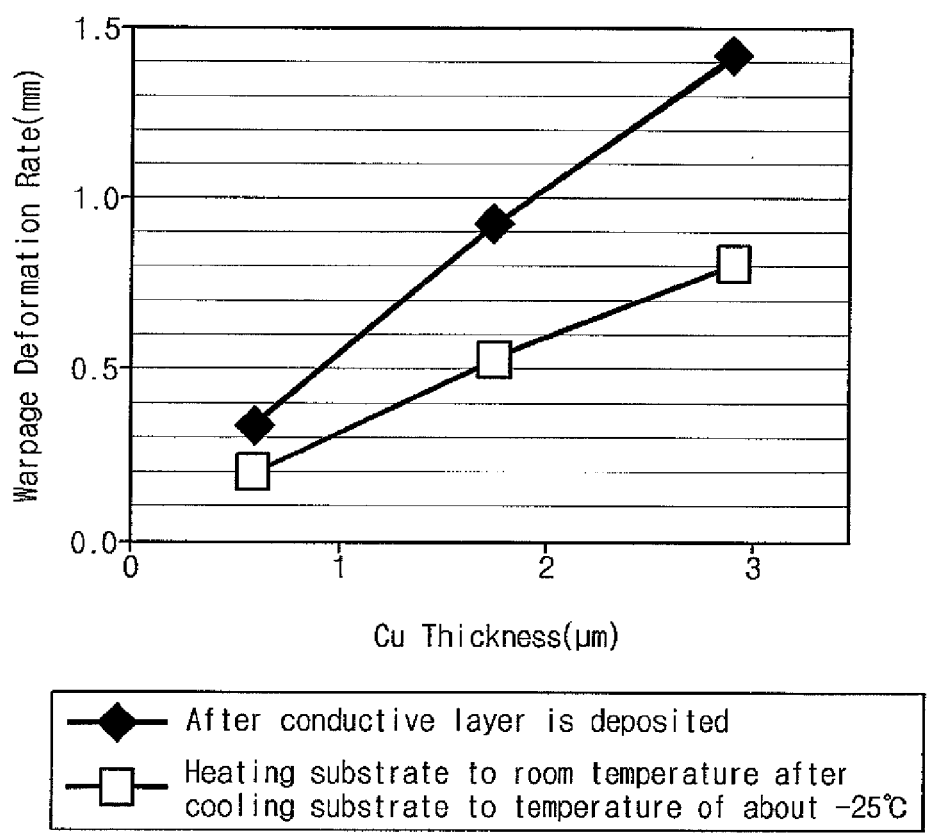
FIG. 8 is a graph for explaining warpage deformation of a target substrate when the target substrate is cooled at a temperature of about −25° C. using the apparatus for fabricating the array substrate of FIG. 6.
Figure 9:
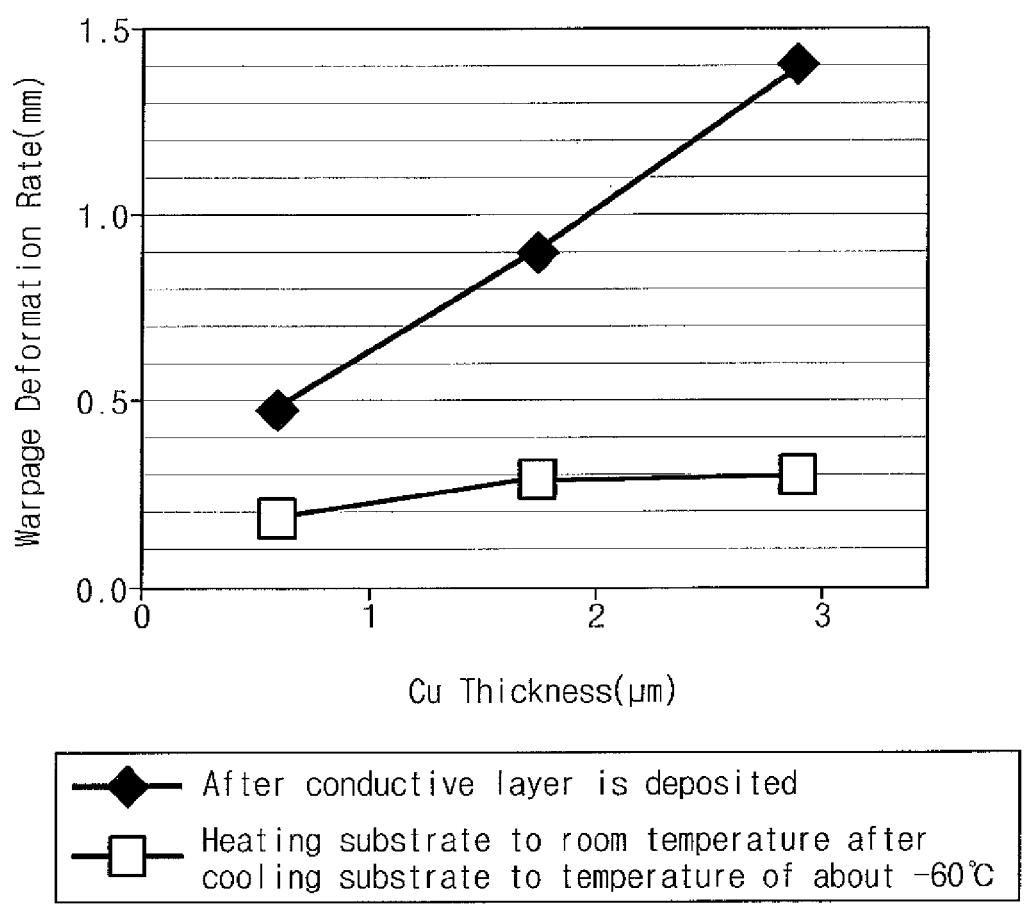
FIG. 9 is a graph for explaining warpage deformation of a target substrate when the target substrate is cooled at a temperature of about −60° C. using the apparatus for fabricating the array substrate of FIG. 6.
Figure 10:
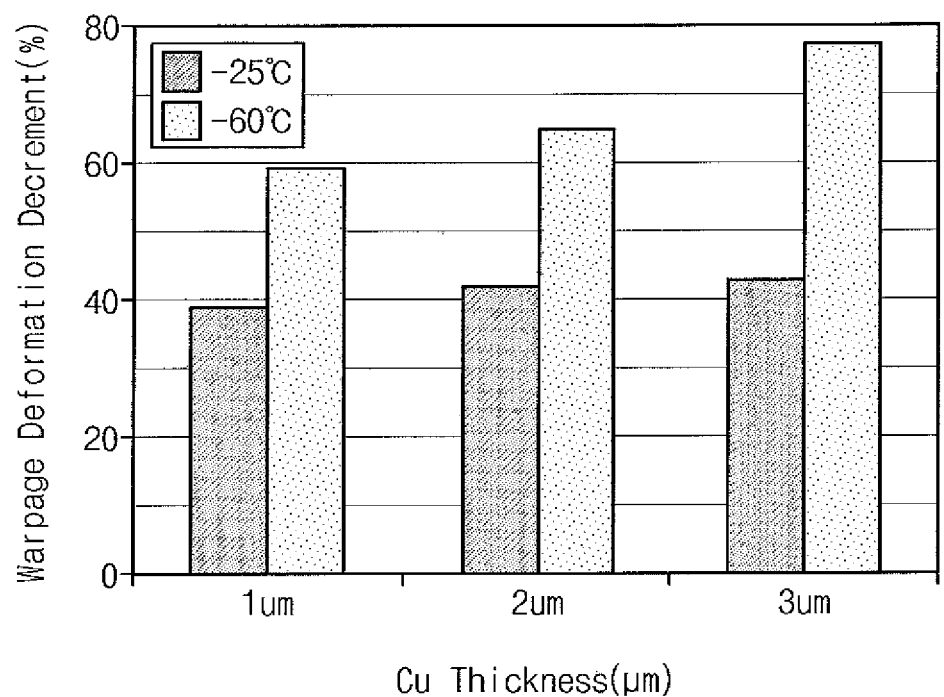
FIG. 10 is a graph for comparing warpage deformation rates of a target substrate when a stress occurring in the target substrate is not relieved and when the stress occurring in the target substrate is relieved using the apparatus for fabricating the array substrate of FIG. 6.

FIG. 7 is a graph for explaining a variation of a stress occurring in a target substrate when the target substrate is cooled and heated using the apparatus for fabricating the array substrate of FIG. 6. FIG. 8 is a graph for explaining warpage deformation of a target substrate when the target substrate is cooled at a temperature of about −25° C. using the apparatus for fabricating the array substrate of FIG. 6. FIG. 9 is a graph for explaining warpage deformation of a target substrate when the target substrate is cooled at a temperature of about −60° C. using the apparatus for fabricating the array substrate of FIG. 6. FIG. 10 is a graph for comparing warpage deformation rates of a target substrate when a stress occurring in the target substrate is not relieved and when the stress occurring in the target substrate is relieved using the apparatus for fabricating the array substrate of FIG. 6. Here, the target substrate may manufactured by, for example, forming a conductive layer formed of a Cu material on a base substrate formed of a transparent glass material with a thickness of about 0.5 mm.

Referring to FIG. 7, it may be seen that a stress occurring in a target substrate is increased when the target substrate on which a conductive layer having a thickness of, for example, about 3 mm is disposed on a base substrate is cooled by using the apparatus for fabricating the array substrate of FIG. 6. The above-mentioned stress applied to the target substrate may occur because of a thermal expansion coefficient difference between the base substrate and the conductive layer.

However, when the cooled target substrate is heated again, the stress occurring in the target substrate may be decreased. The stress occurring in the target substrate may be decreased because the base substrate and the conductive layer are expanded again by the heating of the target substrate to decrease the stress. For example, in a case where the target substrate is cooled to a temperature of about −60° C. and then heated to room temperature, it may be seen that the stress applied to that target substrate is decreased when compared to the target substrate which is cooled to a temperature of about −25° C. and then heated to room temperature.

Referring to FIGS. 8 to 10, in a case where the target substrate is cooled to a temperature of about −25° C. and then heated to room temperature such that the stress applied to that target substrate is relieved, it may be seen that warpage deformation of the target substrate is decreased by about 40% regardless of a thickness of the conductive layer in comparison to the target substrate in which the stress applied to that target substrate is not relieved.

Also, in a case where the target substrate is cooled to a temperature of about −60° C. and then heated to room temperature such that the stress applied to that target substrate is relieved, it may be seen that the warpage deformation of the target substrate is decreased by about 60% to about 80% according to a thickness of the conductive layer in comparison to the target substrate in which the stress applied to that target substrate is not relieved.

FIGS. 11 to 20 are sectional views illustrating a process for fabricating an array substrate using the apparatus for fabricating the array substrate of FIG. 6 in accordance with an exemplary embodiment of the inventive concept.

Figure 11:
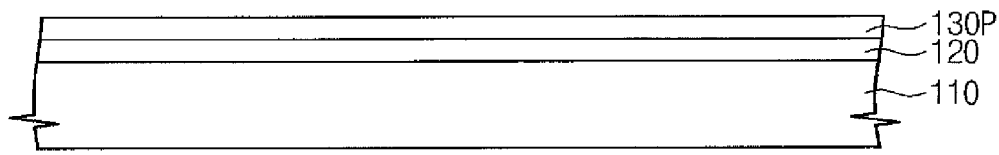
FIGS. 11 to 20 are sectional views illustrating a process for fabricating an array substrate using the apparatus for fabricating the array substrate of FIG. 6 in accordance with an exemplary embodiment of the inventive concept.

Referring to FIG. 11, a base substrate 110 is prepared. The base substrate 110 may be formed of, for example, a light transmitting insulative material such as a transparent glass substrate, a transparent quartz substrate or a transparent plastic substrate. The transparent plastic substrate may include, for example, one of polycarbonate (PC), polyester (PET), polypropylene (PP), polyethylene (PE) and polymethyl methacrylate (PMMA). Alternatively, the base substrate 110 may instead be formed of a non-transparent material such as, for example, a silicon plate or ceramics.

Also, a surface of the base substrate 110 may be planarized substantially. For example, after the base substrate 110 is prepared, a buffer layer 120 is formed on the base substrate 110 using an oxide layer or nitride layer. The buffer layer may be formed of at least one of, silicon oxide, silicon nitride, and silicon oxynitride. Here, the buffer layer 120 may prevent impurities such as metal ions contained in the base substrate 110 from being diffused into an active channel. The buffer layer 120 may be formed by, for example, using a physical vapor deposition (PVD) process or a chemical vapor deposition (CVD) process. Alternatively, the buffer layer 120, if desired may be omitted depending upon the type and process conditions of the base substrate 110.

After the buffer layer 120 is formed, a poly silicon layer 130P is formed on the base substrate 110. Here, the poly silicon layer 130P is formed by depositing an amorphous silicon on the base substrate 110 using, for example, a PVD or CVD process to crystallize the amorphous silicon. Also, a dehydrogenation process for removing hydrogen (H) contained in the amorphous silicon may be performed before the amorphous silicon is crystallized. The process for crystallizing the amorphous silicon may be, for example, one of a solid phase crystallization (SPC) process, an excimer laser crystallization (ELC) process, a sequential lateral solidification (SLS) process, a metal induced crystallization (MIC) process, and a metal Induced lateral crystallization (MILC).

Figure 12:
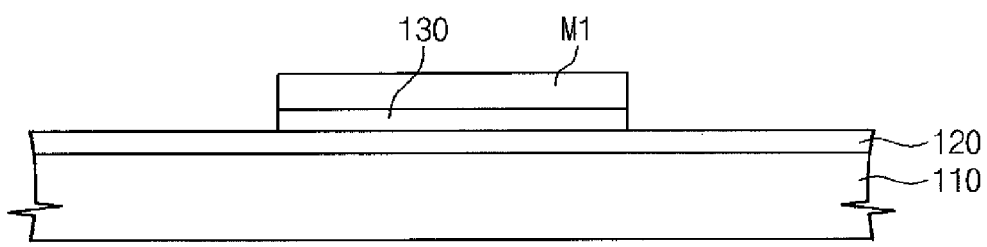

Referring to FIG. 12, after the poly silicon layer 130P is formed, a photoresist is applied to the poly silicon layer 130P to develop the photoresist, thereby forming a first mask M1 for etching. Then, the poly silicon layer 130P is patterned using, for example, the first mask M1 to form a semiconductor layer 130.

Figure 13:
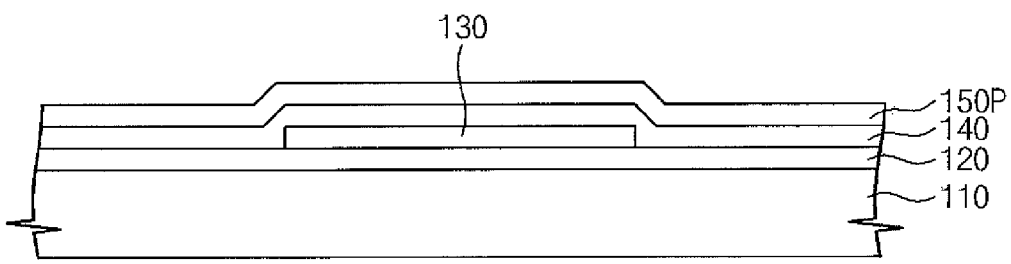

Referring to FIG. 13, after the semiconductor layer 130 is formed, the first mask M1 is removed to form a first insulation layer 140 for covering the semiconductor layer 130. The first insulation layer 140 may be a gate insulation layer disposed between a gate electrode 150 (that will be formed later) and the semiconductor layer 130 to insulate the gate electrode 150 from the semiconductor layer 130.

After the first insulation layer 140 is formed, a first conductive layer 150P formed of a conductive material is formed on the first insulation layer 140. Here, the first conductive layer 150P is insulated from the semiconductor layer 130 by the first insulation layer 140. The first conductive layer 150P may have, for example, a single layer structure formed of one of Cu, MoW, Al, AlNd, Mo, TiW, Ta, Cr, W, Au, Pd, Pt, Ni, Zn, Co or alloys thereof. Also, the first conductive layer 150P may have, for example, a multi-layered structure in which two or more layers of a Cu layer, a Cu alloy layer, a MoW layer, a MoW alloy layer, an Al layer, an Al alloy layer, a Mo layer, a Mo alloy layer, a TiW layer, a TiW alloy layer, a Ta layer, a Ta alloy layer, a Cr layer, a Cr alloy layer, a W layer, a W alloy layer, an Au layer, an Au alloy layer, a Pd layer, a Pd alloy layer, a Pt layer, a Pt alloy layer, a Ni layer, a Ni alloy layer, a Zn layer, a Zn alloy layer, a Co layer, a Co alloy layer are stacked on each other.

The base substrate 110 on which the first conductive layer 150P is formed is provided into the apparatus for fabricating the array substrate 100 of FIG. 6 to relieve a stress occurring in the base substrate 110 on which the first conductive layer 150P is formed.

For example, the base substrate 110 on which the first conductive layer 150P is formed is provided into a first load lock chamber 21.

When the base substrate 110 on which the first conductive layer 150P is formed is provided into the first load lock chamber 21, the first load lock chamber 21 is decompressed from an air pressure state into a vacuum state. Thus, by providing the base substrate 110 on which the first conductive layer 150P is formed directly into a vacuum environment, the first load lock chamber 21 may prevent the base substrate 110 on which the first conductive layer 150P is formed from being damaged due to the changing of the atmospheric pressure.

When the first load lock chamber 21 is maintained in the vacuum state, the base substrate 110 on which the first conductive layer 150P is formed is provided into a cooling chamber 22 and then seated on a cooling plate 22B. Here, a first chamber housing 22A of the cooling chamber 22 is maintained, for example, in a vacuum state, which is similar to the vacuum state in the first load lock chamber 21. Also, the cooling plate 22B cools the base substrate 110 on which the first conductive layer 150p is formed to, for example, a temperature of about −25° C. to about −60° C.

When the base substrate 110 on which the first conductive layer 150P is formed is cooled, the base substrate 110 on which the first conductive layer 150P is formed is provided into a heating chamber 23 and then seated on a heating plate 23B. Here, a second chamber housing 23A of the heating chamber 23 is maintained in a vacuum state, which is similar to the vacuum state in the first load lock chamber 21 and the first chamber housing 22A. Also, the heating plate 23B is heated to heat the base substrate 110 on which the first conductive layer 150P is formed to, for example, room temperature.

When the base substrate 110 on which the first conductive layer 150P is formed is heated to room temperature, the base substrate 110 on which the first conductive layer 150P is formed is provided into a second load lock chamber 24. When the base substrate 110 on which the first conductive layer 150P is formed is provided into the second load lock chamber 24, the second load lock chamber 24 is compressed, for example, from the vacuum state to an air pressure state. Thus, by providing the base substrate 110 on which the first conductive layer 150P is formed directly into the air pressure state, the second load lock chamber 24 may prevent the base substrate 110 on which the first conductive layer 150P is formed from being damaged due to the changing of the atmospheric pressure.

As described above, the stress occurring in the base substrate 110 on which the first conductive layer 150P is formed may be relieved using the apparatus for fabricating the array substrate 100.

Figure 14:
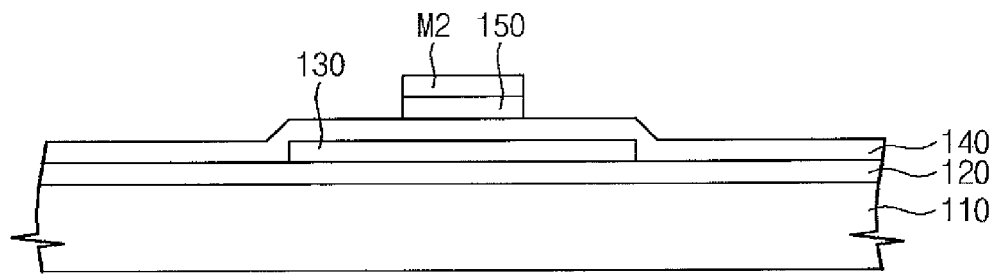

Referring to FIG. 14, a photoresist is applied to the first conductive layer 150p to develop the photoresist, thereby forming a second mask M2.

Then, the first conductive layer 150p is patterned using, for example, the second mask M2. As a result, a gate electrode 150 and a gate line GL may be formed.

Figure 15:
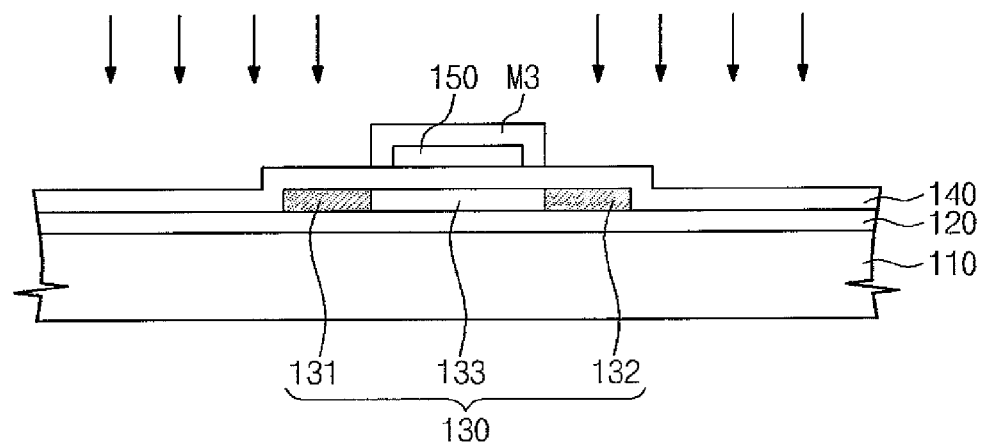

For example, referring to FIG. 15, after the gate electrode 150 and the gate line GL are formed, a third mask M3 covering the gate electrode 150 to expose both edges of the semiconductor layer 130 is formed.

After the third mask M3 is formed, a process of, for example, injecting high-concentration impurities into the semiconductor layer 130 is performed using the third mask M3 to form a source region 131 and drain region 132 in the exposed regions of the semiconductor layer 130.

Here, in, a case where a thin film transistor TFT according to this embodiment includes an N channel, the impurity injection process may be a process for injecting $N^+$ impurities. Also, in a case where the thin film transistor TFT according to this embodiment includes a P channel, the impurity injection process may be a process for injecting $P^+$ impurities.

Figure 16:
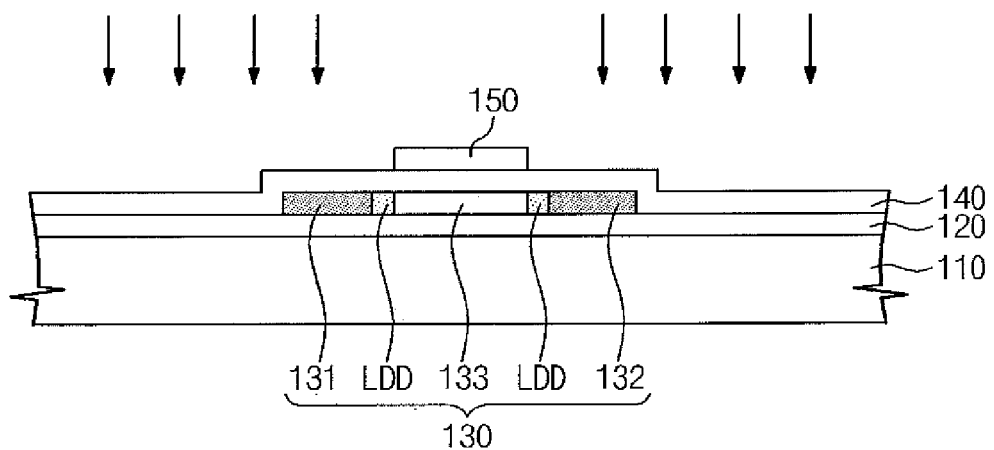

Referring to FIG. 16, after the source region 131 and the drain region 132 are formed, the third mask M3 is removed. Then, a process for injecting low-concentration impurities is performed using the gate electrode 150 as a mask. Here, in a case where the thin film transistor TFT according to this embodiment includes an N channel, the impurity injection process may be a process for injecting $N^-$ impurities. Also, in a case where the thin film transistor TFT according to this embodiment includes a P channel, the impurity injection process may be a process for injecting $P^-$ impurities.

Thus, since the process for injecting the low-concentration impurities is performed, the semiconductor layer 130 may have a structure having the source region 131, the drain region 132, a channel region 133 formed under the gate electrode 150, and a low-concentration impurity region LDD formed between the source/drain regions 131 and 132 and the channel region 133.

In the present exemplary embodiment, the low-concentration impurity region LDD is formed after the source and drain regions 131 and 132 which are high-concentration impurity regions are formed but exemplary embodiments of the inventive concept are not limited thereto. For example, the low-concentration impurities may be injected using the gate electrode 150 as a mask to form a photoresist pattern (PR). Then, the high-concentration impurities may be, for example, injected using the photoresist pattern (PR) as a mask to form the source region 131, the drain region 132, and the low-concentration impurity region LDD.

Figure 17:
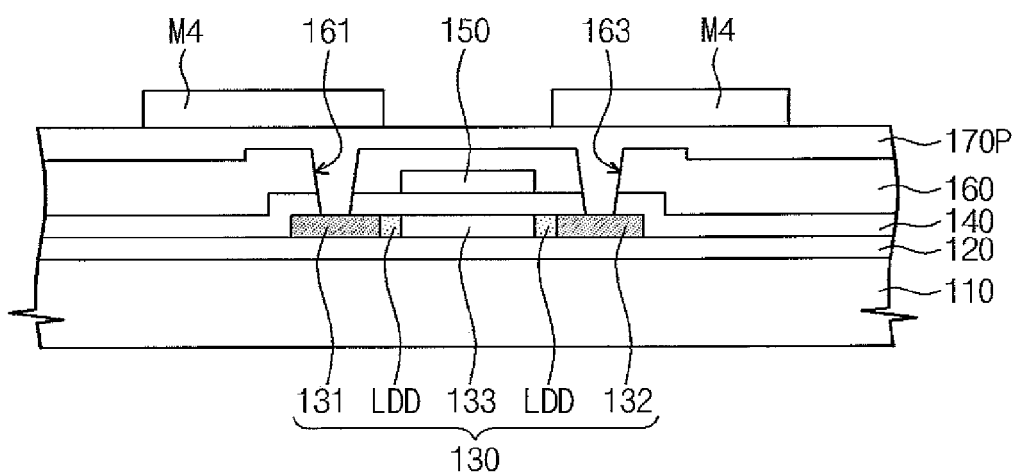

Referring to FIG. 17, after the low-concentration impurity region LDD is formed, a second insulation layer 160 covering the gate electrode 150 is formed. The second insulation layer 160 is formed, for example, on the first insulation layer 140 and the gate electrode 150. Also, the second insulation layer 160 may be an interlayer insulation layer. Moreover, as will be described in further detail below in connection with FIG. 18, the second insulation layer 160 will be disposed between source and drain electrodes 171 and 175 and the gate electrode 150 to insulate the source and drain electrodes 171 and 175 from the gate electrode 150 after the source and drain electrodes 171 and 175 are formed.

After the second insulation layer 160 is formed, the second insulation layer 160 is patterned to form, for example, first and second contact holes 161 and 163 through which portions of the source and drain regions 131 and 132 are exposed respectively.

After the first and second contact holes 161 and 163 are formed, a second conductive layer 170P is formed on the second insulation layer 160. Here, the second conductive layer 170P may be formed of, for example, the same material as the first conductive layer 150P.

For example, after the second conductive layer 170P is formed, the base substrate 110 on which the second conductive layer 170P is formed is provided into the apparatus for fabricating the array substrate 100 of FIG. 6 to relieve the stress occurring in the base substrate 110 on which the second conductive layer 170P is formed. For example, the base substrate 110 having the second conductive layer 170P formed thereon may be treated in the apparatus for fabricating the array substrate 100 of FIG. 6 to relieve the stress occurring in the base substrate 110 in substantially the same manner as described above in connection with the first conductive layer 150P.

Then, a photoresist is applied to the second conductive layer 170P to develop the photoresist, thereby forming a fourth mask M4.

Figure 18:
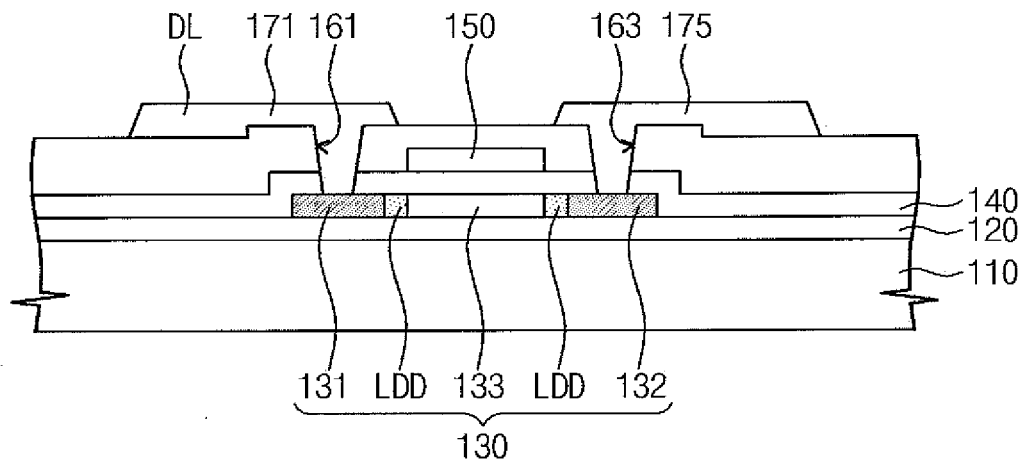

Referring to FIG. 18, the second conductive layer 170P is patterned using, for example, the fourth mask M4. When the second conductive layer 170P is patterned, a data line DL, the source electrode 171, and the drain electrode 175 are formed to form a thin film transistor TFT including the semiconductor layer 130, the gate electrode 150, the source electrode 171, and the drain electrode 175. Here, the source electrode 171 is connected to the source region 131 through the first contact hole 161 exposing the source region 131. Also, the drain electrode 175 is connected to the drain region 132 through the second contact hole 163 exposing the drain region 132.

Figure 19:
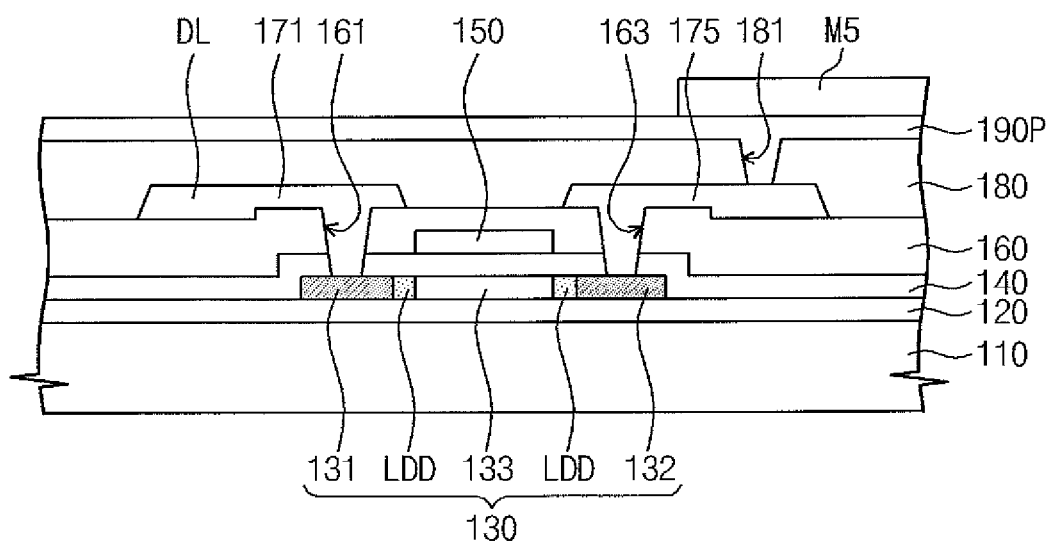

Referring to FIG. 19, the fourth mask M4 is removed after the thin film transistor TFT is formed. Then, a third insulation layer 180 for covering the thin film transistor TFT to protect the thin film transistor TFT from an external environment is formed. The third insulation layer 180 may be formed by, for example, depositing an inorganic insulation material or an organic insulation material on the second insulation layer 160 on which the data line DL, the source electrode 171, and the drain electrode 175 are formed. Also, the third insulation layer 180 may have, for example, a multi-layered structure in which an inorganic insulation layer and an organic insulation layer are stacked on each other.

After the third insulation layer 180 is formed, the third insulation layer 180 is patterned to form a via hole 181 exposing a portion of the drain electrode 175.

For example, the first insulation layer 140, the second insulation layer 160 and the third insulation layer 180 may be made of, for example, silicon nitride (SiNx), silicon oxide (SiOx), silicon oxynitride (SiOxNy), aluminum oxide (AlOx), yttrium oxide ($Y_2O_3$), hafnium oxide (HfOx), zirconium oxide (ZrOx), aluminum nitride (AlN), aluminum oxynitride (AlNO), titanium oxide (TiOx), barium titanate (BaTiO3), lead titanate ($PbTiO_3$), benzocyclobutene (BCB), an acrylic material or a combination thereof.

After the via hole 181 is formed, a conductive material is deposited on an entire surface of the base substrate 110 to form a third conductive layer 190P. Here, the third conductive layer 190P may be formed of, for example, one of the following transparent conductive oxides such as indium tin oxide (ITO), indium zinc oxide (WO), Indium Tin Zinc Oxide (ITZO), aluminum zinc oxide (AZO), gallium doped zinc oxide (GZO), zinc tin oxide (ZTO), GTO (gallium tin oxide), and FTQ (fluorine doped tin oxide). Alternatively, the third conductive layer 190P may be composed of, for example, a reflective electric conductor such as aluminum (Al), gold (Au), silver (Ag), copper (Cu), iron (Fe), titanium (Ti), tantalum (Ta), molybdenum (Mo), rubidium (Rb), tungsten (W), and alloys, or combinations thereof.

For example, after the third conductive layer 190P is formed, the base substrate 110 on which the third conductive layer 190P is formed is provided into the apparatus for fabricating the array substrate 100 of FIG. 6 to relieve the stress occurring in the base substrate 110 on which the third conductive layer 190P is formed. For example, the base substrate 110 having the third conductive layer 190P formed thereon may be treated in the apparatus for fabricating the array substrate 100 of FIG. 6 to relieve the stress occurring in the base substrate 110 in substantially the same manner as described above in connection with the first conductive layer 150P.

Then, a photoresist is applied to the third conductive layer 190P to develop the photoresist, thereby forming a fifth mask M5.

Figure 20:
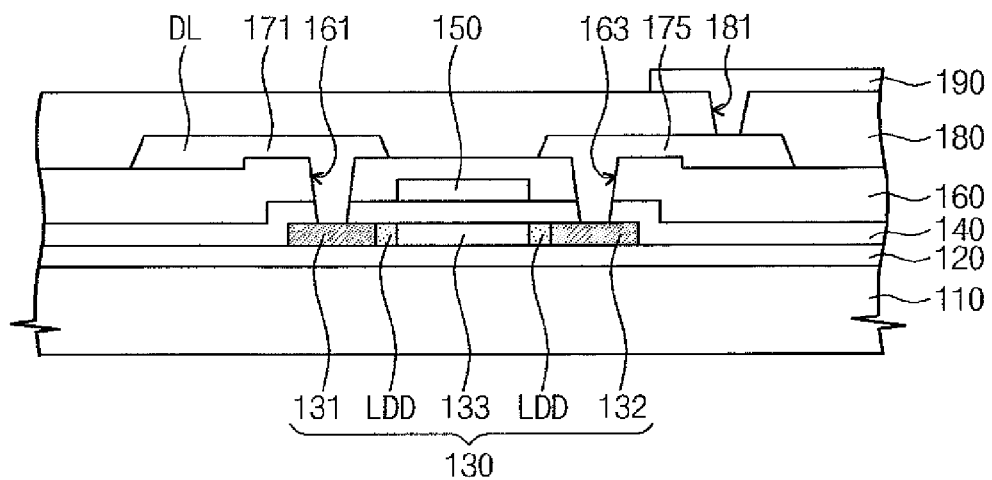

Referring to FIG. 20, when the third conductive layer 190P is patterned using the fifth mask M5, a pixel electrode 190 connected to the drain electrode 175 through the via hole 181 is formed.

After the pixel electrode 190 is formed, a process such as, for example, an ashing process or the like is performed to remove the fifth mask M5.

Figure 21:
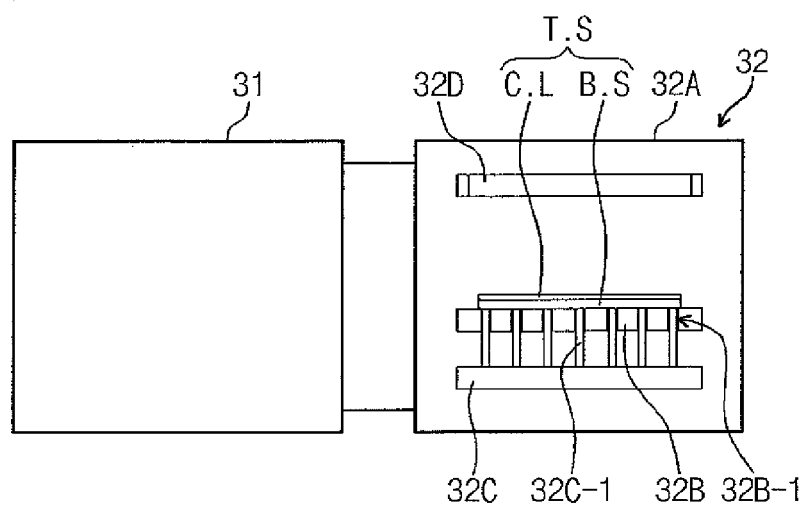
FIG. 21 is a conceptual view for explaining an apparatus for fabricating an array substrate according to an exemplary embodiment of the inventive concept.
Figure 22:
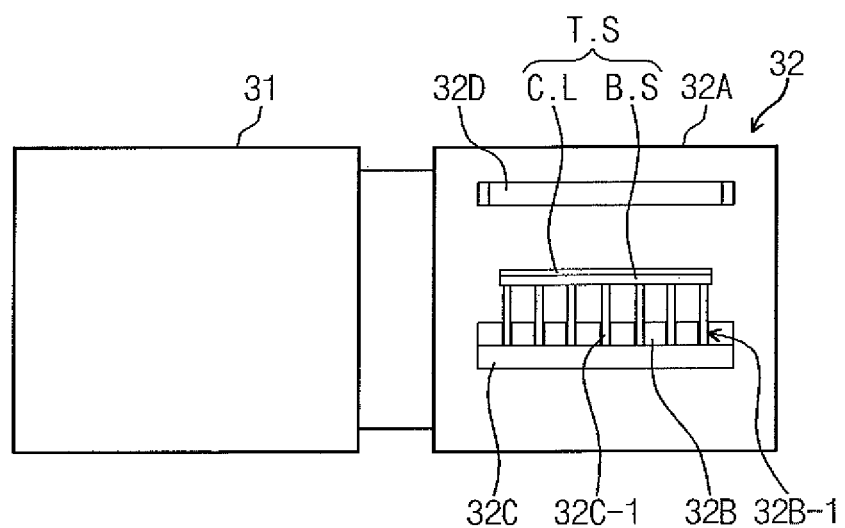
FIG. 22 is a conceptual view for explaining an operation of the apparatus for fabricating the array substrate of FIG. 21.

FIG. 21 is a conceptual view for explaining an apparatus for fabricating an array substrate according to an exemplary embodiment of the inventive concept. FIG. 22 is a conceptual view for explaining an operation of the apparatus for fabricating the array substrate of FIG. 21. Here, since an apparatus for fabricating an array substrate of FIGS. 21 and 22 is similar to the apparatus for fabricating the array substrate of FIG. 6, only different points therebetween will be mainly described, and also the same point will be schematically described or omitted.

Referring to FIGS. 21 and 22, the apparatus for fabricating the array substrate may include a load lock chamber 31 and a substrate treatment chamber 32.

A target substrate T.S may include, for example, a conductive layer C.L disposed on a base substrate B.S. The target substrate T.S is transferred into the substrate treatment chamber 32 through the load lock chamber 31. Then, a stress applied to the target substrate T.S is relieved or reduced in the substrate treatment chamber 32 and then the target substrate T.S is taken out of the substrate treatment chamber 32 through the load lock chamber 31.

The load lock chamber 31 connects the substrate treatment chamber 32 to air at, for example, an atmospheric pressure state. Also, when the target substrate T.S is provided into the load lock chamber 31 under the atmospheric pressure state, the inside of the load lock chamber 31 may be decompressed into, for example, a vacuum state. When the target substrate T.S is provided into the load lock chamber 31 under the vacuum state, the inside of the load lock chamber 31 is compressed into, for example, an air pressure state.

The substrate treatment chamber 32 may include, for example, a chamber housing 32A, a cooling plate 32B, a substrate elevation device 32C, and a heating lamp or heating plate 32D. The chamber housing 32A may provide an inner space for receiving the target substrate T.S, the cooling plate 32B, the substrate elevation device 32C, and the heating lamp or heating plate 32D therein. Also, the inside of the chamber housing 32A may be maintained, for example, in a vacuum state.

The cooling plate 32B is disposed in the inner space of the chamber housing 32A to seat the target substrate T.S thereon. The cooling plate 32B may cool the target substrate T.S to a temperature of, for example, about −25° C. to about −60° C. Also, the cooling plate 32B may have, for example, a plurality of through holes 32B-1.

The substrate elevation device 32C is disposed under the cooling plate 22B.

Also, the substrate elevation device 32C includes, for example, a plurality of substrate support pins 32C-1 which are respectively inserted into the through holes 32B-1. When the substrate elevation device 32C is operated to elevate the substrate support pins 32C-1, the target substrate T.S cooled by the cooling plate 32B is elevated and thus spaced from the cooling plate 32B.

When the target substrate T.S is elevated by the substrate elevation device 32C, then heat from the heating lamp or heating plate 32D is radiated onto the cooled target substrate T.S to heat the target substrate T.S. Here, the target substrate T.S may be heated to, for example, room temperature.

Hereinafter, an operation of the apparatus for fabricating the array substrate will be described by way of example.

The conductive layer C.L is disposed on the base substrate B.S, and then, the target substrate T.S is provided into the substrate treatment chamber 32 through the load lock chamber 31.

When the target substrate T.S is seated on the cooling plate 32B of the substrate treatment chamber 32, the cooling plate 3213 may cool the target substrate T.S to a temperature of, for example, about −25° C. to about −60° C.

When the target substrate T.S is cooled, the substrate elevation device 32C is operated to elevate the substrate support pins 32C-1. As a result, the target substrate T.S is spaced apart from the cooling plate 32B as shown in FIG. 22. Here, the target substrate T.S is supported by the substrate support pins 32C-1.

When the target substrate T.S is spaced from the cooling plate 32B, the heating lamp or heating plate 32D heats the target substrate T.S to, for example, room temperature.

When the target substrate T.S is heated to room temperature, the target substrate T.S is provided into the load lock chamber 31 so that a process for fabricating the array substrate is performed.

In a method for fabricating a array substrate and a fabrication apparatus used therefor in accordance with an exemplary embodiment of the inventive concept, a stress occurring due to the thermal expansion coefficient difference between a substrate and a conductive layer may be removed or relieved to prevent the warpage phenomenon of the substrate from occurring.

Having described exemplary embodiments of the inventive concept, it is further noted that it is readily apparent to those of ordinary skill in the art that various modifications may be made without departing from the spirit and scope of the invention which is defined by the metes and bounds of the appended claims.

What is claimed is:

1. An apparatus for fabricating an array substrate, the apparatus comprising:
    a first load lock chamber configured to receive a target substrate, on which a conductive layer is disposed, therein and configured to decompress atmospheric pressure therein and switch from an air pressure state therein into a vacuum state therein when the target substrate is received therein;
    a cooling chamber comprising a first chamber housing configured for receiving the target substrate directly from the first load lock chamber and further comprising a cooling plate disposed within the first chamber housing which is configured to seat the target substrate thereon and to cool the target substrate while it is in the vacuum state;
    a heating chamber comprising a second chamber housing configured for receiving the cooled target substrate directly from the cooling chamber and further comprising a heating plate disposed within the second chamber housing which is configured to seat the target substrate thereon and to heat the cooled target substrate while it is in the vacuum state; and
    a second load lock chamber directly connected to the heating chamber, wherein the second load lock chamber is configured to receive the heated target substrate directly from the heating chamber and configured to compress air and switch from a vacuum state therein into an air pressure state therein when the heated substrate is received therein,
    wherein the cooling chamber and the heating chamber are directly connected to each other and are disposed between the first load lock chamber and the second load lock chamber.

2. The apparatus of claim 1, wherein the cooling chamber is configured to maintain a vacuum state therein and the heating chamber is configured to maintain a vacuum state therein.

* * * * *